(12) United States Patent
Ihlefeld et al.

(10) Patent No.: US 9,255,347 B2
(45) Date of Patent: Feb. 9, 2016

(54) VOLTAGE TUNABILITY OF THERMAL CONDUCTIVITY IN FERROELECTRIC MATERIALS

(71) Applicants: Sandia Corporation, Albuquerque, NM (US); Patrick E. Hopkins, Charlottesville, VA (US)

(72) Inventors: Jon Ihlefeld, Albuquerque, NM (US); Patrick Edward Hopkins, Charlottesville, VA (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/546,147

(22) Filed: Nov. 18, 2014

(65) Prior Publication Data

US 2015/0144588 A1   May 28, 2015

Related U.S. Application Data

(60) Provisional application No. 61/907,804, filed on Nov. 22, 2013.

(51) Int. Cl.
| | | |
|---|---|---|
| *C30B 29/22* | (2006.01) | |
| *C30B 29/24* | (2006.01) | |
| *C30B 29/32* | (2006.01) | |
| *H01B 1/00* | (2006.01) | |
| *C09K 13/00* | (2006.01) | |
| *B24B 37/04* | (2012.01) | |
| *B81C 1/00* | (2006.01) | |

(52) U.S. Cl.
CPC ............... *C30B 29/32* (2013.01); *B24B 37/042* (2013.01); *C09K 13/00* (2013.01); *C30B 29/22* (2013.01); *C30B 29/24* (2013.01); *B81C 1/00476* (2013.01); *H01B 1/00* (2013.01)

(58) Field of Classification Search
None
See application file for complete search history.

(56) References Cited

U.S. PATENT DOCUMENTS

2004/0232893 A1* 11/2004 Odagawa ............... H01L 37/00
320/154

* cited by examiner

*Primary Examiner* — Anita Alanko
(74) *Attorney, Agent, or Firm* — Kevin W. Bieg

(57) ABSTRACT

A method to control thermal energy transport uses mobile coherent interfaces in nanoscale ferroelectric films to scatter phonons. The thermal conductivity can be actively tuned, simply by applying an electrical potential across the ferroelectric material and thereby altering the density of these coherent boundaries to directly impact thermal transport at room temperature and above. The invention eliminates the necessity of using moving components or poor efficiency methods to control heat transfer, enabling a means of thermal energy control at the micro- and nano-scales.

26 Claims, 8 Drawing Sheets

Role of Symmetry Across Boundary

90° Domain Boundary

109° Domain Boundary

Role of Strain Across Boundary

δ up to 6%

Thermal Conductivity vs Temperature

Field Applied

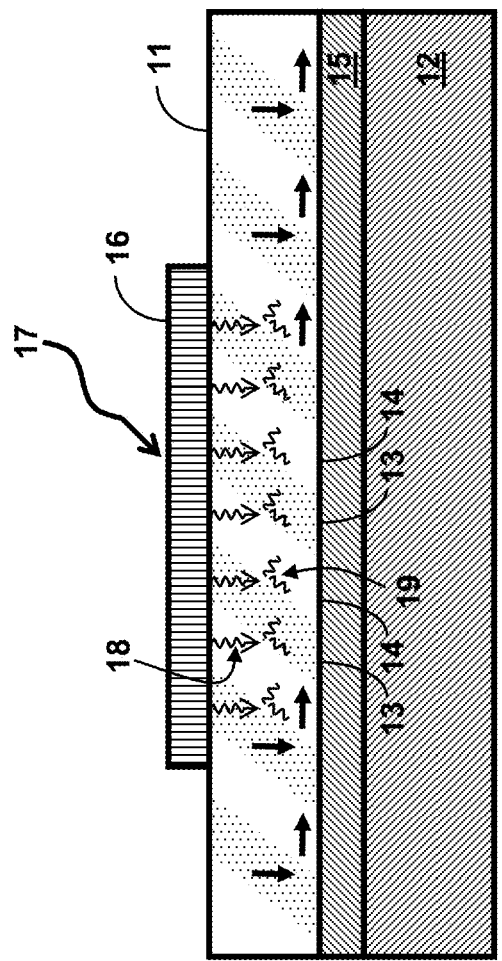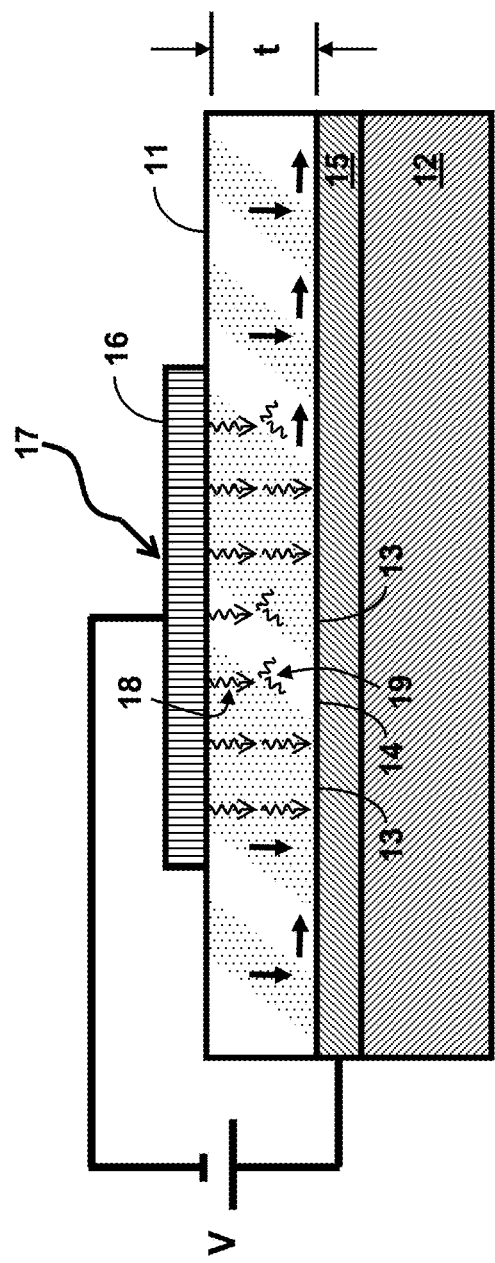

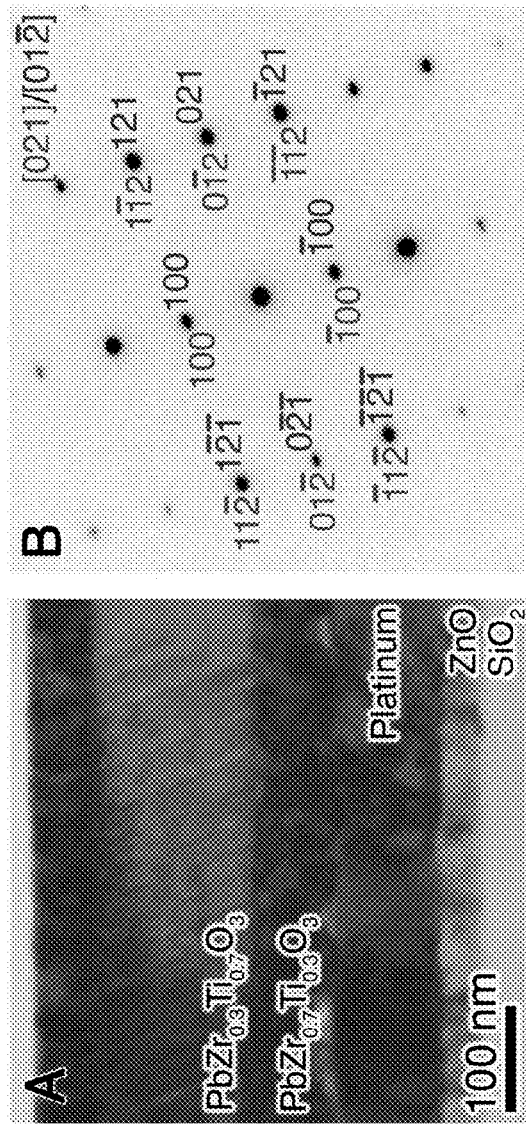
FIG. 6A
FIG. 6B
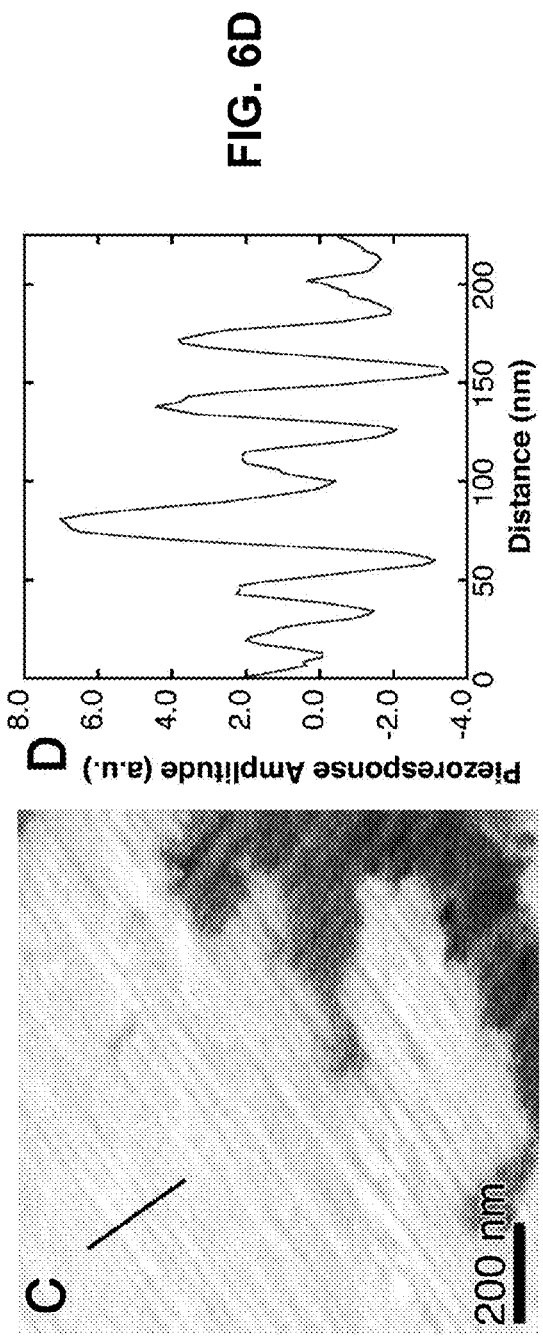
FIG. 6C
FIG. 6D

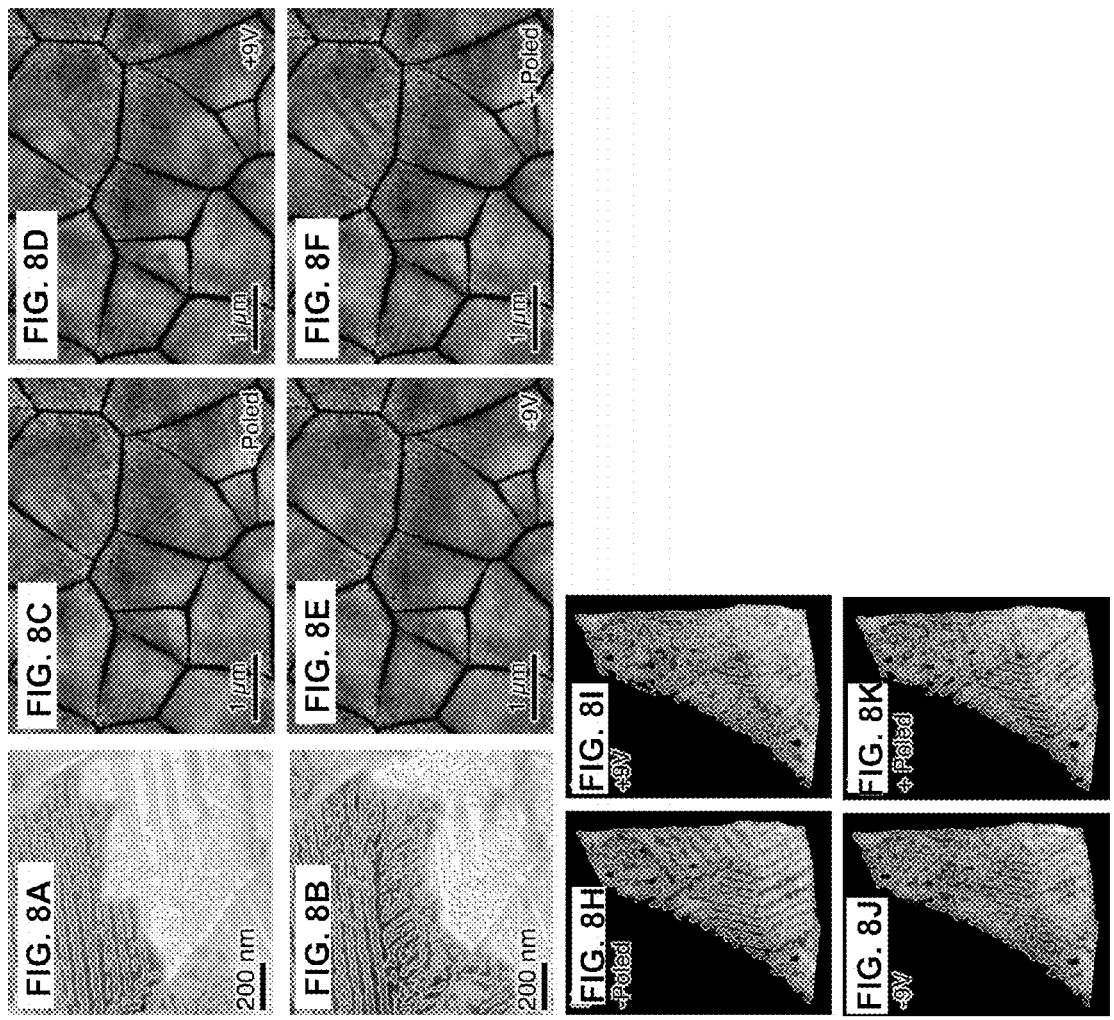

VOLTAGE TUNABILITY OF THERMAL CONDUCTIVITY IN FERROELECTRIC MATERIALS

CROSS-REFERENCE TO RELATED APPLICATION

This application claims the benefit of U.S. Provisional Application No. 61/907,804, filed Nov. 22, 2013, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to thermal conductivity in solid state materials and, in particular, to a method for voltage tunability of thermal conductivity in ferroelectric materials.

BACKGROUND OF THE INVENTION

Thermal energy transport across interfaces is a topic of great recent interest. Largely this resurgence is motivated by a necessity to control heat generated in microelectronics and to develop new higher-performance thermoelectric materials for cooling applications and energy harvesting. The interfaces in these materials, however, are static and immobile without gross material deformation. Separately, there has been a need for appropriate materials or nanosystems where thermal conductivity can be actively altered or rectified. Typically this is provided by mechanical means (physical separation) or through the use of one-dimensional materials (nanowires) that can only carry minute amounts of thermal energy.

It is well known that as material characteristic dimension (thickness, grain size, etc.) scales toward nanometer length scales, the role of interfaces on thermal transport become increasingly important. This phenomenon is driven largely by the fact that the bulk of heat is carried by phonons with mean free paths of 1-100 nm. See D. G. Cahill et al., *J. Appl. Phys.* 93, 793 (2003). Therefore, as material dimensions approach these length scales, they become comparable to the phonon wavelengths. This trend has fueled a substantial recent increase in studies into preparation of thermoelectric materials with fine grain sizes and superlattice structures where a high density of incoherent, highly disordered interfaces has been shown to scatter phonons and decrease thermal conductance. See Z. J. Wang et al., *Nano Lett.* 11, 2206 (2011); S. K. Bux et al., *Adv. Funct. Mater.* 19, 2445 (2009); G. Joshi et al., *Nano Lett.* 8, 4670 (2008); B. Poudel et al., *Science* 320, 634 (2008); W. J. Xie et al., *Appl. Phys. Lett.* 94, 102111 (2009); Y. C. Lan et al., *Adv. Funct. Mater.* 20, 357 (2010); W. S. Capinski et al., *Phys. Rev. B* 59, 8105 (1999); R. Venkatasubramanian et al., *Nature* 413, 597 (2001); and S. M. Lee et al., *Appl. Phys. Lett.* 70, 2957 (1997).

Coherent and semi-coherent interfaces, those where there is atomic registry across the interface with limited dislocation densities, have been shown and calculated to decrease thermal transport in many systems. See R. M. Costescu et al., *Phys. Rev. B* 67, 054302 (2003); G. J. Riedel et al., *IEEE Electron Device Lett.* 30, 103 (2009); P. E. Hopkins et al., *ADDI. Phys. Lett.* 98, 231901 (2011); and M. Kazan et al., *Surf. Sci. Rep.* 65, 111 (2010). The resulting thermal boundary resistance associated with these coherent interfaces is commonly modeled with acoustic mismatch or diffuse mismatch models where differences in the phonon dispersion spectra of the two materials results in scattering of phonons at the coherent interface. Interestingly, it has also been shown that coherent interfaces in chemically homogeneous systems can also possess an interface thermal boundary resistance. This has been successfully modeled using molecular dynamics simulations of $\Sigma 3$ (111) boundaries in silicon. See S. Aubry et al., *Phys. Rev. B* 78,064112 (2008). A discontinuous change in the temperature gradient across the coherent boundary was predicted that amounted to a ~1% decrease in absolute temperature across the boundary. While the thermal boundary resistance computed for the coherent boundary was an order of magnitude less than that computed across an incoherent grain boundary, this work did show that even boundaries where crystalline coherence is maintained can scatter phonons and decrease thermal conductivity.

In addition to interface effects on thermal conductivity, where an interface can effectively introduce a thermal resistance to heat transport, strain can also affect thermal conductivity. Just as reducing the characteristic material dimensions to length scales similar to those of heat-carrying phonon wavelengths can decrease thermal transport by increasing interactions with interfaces, decreasing material dimensions can also result in increased strain effects. This is particularly true in thin film materials, where layers thinner than the critical thickness for strain relaxation are routinely prepared. It has been predicted that the presence of strain causes shifts in phonon dispersion curves that dictate phonon group velocities and specific heats and, ultimately, thermal conductivity. See X. B. Li et al., *Phys. Rev. B* 81, 195425 (2010). Materials in compressive strain tend to have increased thermal conductance; those in tensile strain tend to have decreased thermal conductivity. Simulations predict that films under tensile strains of less than 10% display as much as a factor of two lower thermal conductivity than films in an unstrained state.

The majority of recent thermal conductivity studies have been focused on semiconductor and metallic systems—those typically encountered in microelectronics where thermal energy control is a significant challenge for device scaling. Less studied are the thermal properties of ferroelectric materials. Given the preponderance of ferroelectric and piezoelectric materials in applications where heat production and control must also be closely controlled (for example in medical ultrasound transducers and as circuit elements in microwave devices), this lack of study is somewhat surprising.

The linkage of ferroelectricity and phonon dispersion is well documented. It is the condensation of a transverse optical "soft" phonon mode that results in the stabilization of the dipole moment that gives rise to the reorientable polarization that is the hallmark of ferroelectric response. In spite of the significant computational and experimental studies on this optical phonon response, the study of thermal properties of these materials remains limited. The thermal properties that have been measured are typically done so on bulk ceramic or single crystalline samples. These studies have shown that ferroelectric materials tend to possess relatively low thermal conductivities with values at room temperature ranging from ~20 $W\text{-}m^{-1}\text{-}K^{-1}$ for $KTaO_3$ to ~1 $W\text{-}m^{-1}\text{-}K^{-1}$ for the relaxor $Pb(Mg_{1/3}Nb_{2/3})O_3$ (a relaxor ferroelectric is a single crystal or engineered ceramic with extraordinarily high electrostrictive constants). See M. Tachibana et al., *Appl. Phys. Lett.* 93, 092902 (2008); and M. Tachibana and E. Takayama-Muromachi, Phys. Rev. B 79, 100104 (2009). It has been observed that there are discontinuities in the thermal properties at the paraelectric/ferroelectric and ferroelectric/ferroelectric phase transitions that are the result of the latent heat associated with the first order phase transitions. The very low amorphous-like thermal conductivities of the relaxor ferroelectric materials has been attributed to the existence of nanoscale composition fluctuations, which also give rise to polar nanoregions and complexities associated with 'soft' optical phonon modes interacting with the phonon modes responsible for heat conduction.

Domain boundaries are coherent interfaces in ferroelectric materials separating regions of differing polarization. As ferroelectricity is only possible in non-centrosymmetric crystal structures, these boundaries cannot be atomically abrupt owing to differing lattice parameters along the crystal axes. Rather, these boundaries are graded, as shown in FIGS. 1A and 1B, and typically span several unit cells, or approximately 1-2 nm in thickness. See S. Stemmer et al., *Philos. Maq. A-Phys. Condens. Matter Struct. Defect Mech. Prop.* 71, 713 (1995). The several unit cells are required to accommodate strain across the domain boundary, as shown in FIG. 1C. Regardless of this distortion, no bonds are broken across the interface, which therefore remains coherent. These domain boundaries form to minimize the energy of the system; domains will form to the point where the energy cost of forming domain walls surpasses the energy cost of not having walls. In a mono-poled ferroelectric single crystal, for example, an electric field will form across the crystal as a result of surface charges that develop to compensate for the polarization. This results in a destabilizing of the polarization. There are several mechanisms that can occur to compensate for this depolarization field, including compensating charges from the surrounding environment, polarization gradients through the thickness of the crystal, or formation of domains. Randomly oriented domains would possess no net polarization and therefore remain stable. In mechanically constrained crystals, such as within ceramic grains or thin films, domain structures can also form to minimize the mechanical strain energy in the system.

Domain boundaries have previously been observed to decrease the thermal conductivity of bulk ceramic and single crystalline ferroelectric materials in a very limited number of studies. See A. J. H. Mante and J. Volger, *Physica* 52, 577 (1971); Q. Lin and D. M. Zhu, *Phys. Rev. B* 49, 16025 (1994); and M. A. Weilert et al., *Phys. Rev. Lett.* 71, 735 (1993). In these previous studies, it was observed that at cryogenic temperatures—temperatures where the phonon mean free paths are quite long—the existence of domain walls resulted in a decreased measured thermal conductivity compared to samples where the domain wall concentration was reduced. For example, an applied electric field has been shown to reduce the thermal conductivity of a barium titanate ($BaTiO_3$) single crystal at cryogenic temperatures. See A. J. H. Mante and J. Volger, *Physica* 52, 577 (1971). The application of the electric field acts to reduce the domain wall density by providing a driving force to align ferroelectric dipoles by growth of favorably aligned domains into less favorably aligned domains. At ~10K, there was an 80% difference in thermal conductivity between poled (electric field of 11 kV/cm) and un-poled $BaTiO_3$. As the thermal conductivity values reported for all materials only spans a few orders of magnitude (~1 $W\cdot m^{-1}\cdot K^{-1}$ for $WS_2$ to ~2000 $W\cdot m^{-1}\cdot K^{-1}$ for diamond), this modification of nearly an order of magnitude constitutes a significant change in thermal conductivity. In each of these studies the domain wall dependence of thermal conductivity was only observed at temperatures lower than the onset of Umklapp scattering. This is consistent with the likely large domain wall spacing in these single crystals only disrupting long wavelength phonons. Once enough thermal energy exists in the system to allow for multi-phonon Umklapp processes, the effect of long wavelength phonon scattering on overall thermal conductivity is limited. Therefore, this effect was only present up to the temperature where Umklapp scattering became the dominant phonon scattering mechanism (~30 K) and heretofore was limited to cryogenic temperature regimes.

It is well known that as the dimensions of ferroic crystals and grains decrease, the density of domain walls increases. See G. Catalan et al., *J. Phys.-Condes. Matter* 19, 022201 (2007); and C. Kittel, *Physical Review* 70, 965 (1946). This domain density scaling effect is known as Kittel's Law, and has been widely observed in a broad range of ferromagnetic and ferroelectric single crystals, ceramics, and thin films. For ferroelectric thin films in particular, as the thicknesses decrease to less than a micron, the mean domain wall spacing decreases to $10^2$ nm and below. Therefore, as shown in FIG. 2B, as the ferroelectric layer thickness decreases the domain boundary spacing is smaller than the phonon mean free paths over a broad temperature range, as shown in FIG. 2A. For a 100 nm thick $PbTiO_3$ film, the domain wall spacing (about 20 nm) is estimated to be equivalent to the phonon mean free path at room temperature. See M. Tachibana et al., *Appl. Phys. Lett.* 93, 92902 (2008); G. Soyez et al., *Appl. Phys. Lett.* 77, 1155 (2000); G. Catalan et al., *J. Phys.-Condes. Matter* 19, 022201 (2007); and A. G. Beattie and G. A. Samara, *J. Appl. Phys.* 42, 2376 (1971).

However, a need remains for a ferroelectric material wherein the thermal conductivity can be actively tuned at temperatures greater than 30 K and therefore requires domain boundary spacings that are significantly narrower than available in single crystals and most polycrystalline ceramics.

SUMMARY OF THE INVENTION

The present invention is directed to a method to control thermal conductivity in a ferroelectric material, comprising growing an epitaxial or polycrystalline film of ferroelectric material on a substrate and applying a sufficient electric field across the film to modify the domain structure in the film, thereby altering the thermal conductivity of the film. Preferably, the spacing of the domain walls of the domain structure is comparable to or less than the mean free path of phonons at a temperature of interest, for example, between 30K and 600K. Importantly, the method can be used to control thermal conductivity at approximately room temperature. The thickness of the epitaxial film can typically be less than about five microns. In general, the ferroelectric material can mean a ferroelectric, including relaxor ferroelectrics, a ferroelastic, or a paraelectric material. For example, the ferroelectric material can comprise a perovskite ferroelectric. For example, the perovskite ferroelectric can comprise $(Pb,La)(Zr,Ti,Nb)O_3$, $BaTiO_3$, $BiFeO_3$, or $(Bi,RE)FeO_3$, where RE is a lanthanide metal cation. For example, the ferroelectric material can comprise $(Ba,Sr)TiO_3$, $(Ba,Ca,Sr)TiO_3$, $(Ba,Sr)(Ti,Zr)O_3$, or $(Ba,Sr,Ca,Pb)(Ti,Zr,Hf,Sn)O_3$. In some embodiments, the substrate can comprise a single crystal substrate that has a lattice constant that is different than the ferroelectric film, thereby imposing strain on the film. For example, if the film comprises $BiFeO_3$ and the single crystal substrate comprises $NdGaO_3$, $SrTiO_3$, or $DyScO_3$, a compressive strain can be imposed on the $BiFeO_3$ film. Alternatively, if the film comprises $BiFeO_3$ and the single crystal substrate comprises $GdScO_3$ or $KTaO_3$, a tensile strain can be imposed on the $BiFeO_3$ film. Alternatively, if the film comprises $Pb(Zr,Ti)O_3$ and the single crystal substrate comprises non-perovskite spinel (MgAl$_2$O$_4$) or rocksalt (MgO), a tensile strain can be imposed on the Pb(Zr,Ti)O$_3$ film. In some embodiments, the substrate can comprise a vicinal substrate. For example, if the film comprises BiFeO$_3$ and the vicinal substrate comprises (001)-oriented SrTiO$_3$, a compressive strain can be imposed on the BiFeO$_3$ film. In other embodiments, the substrate can comprise a metallized silicon substrate. For example, the substrate can be Pt/Si, Pt/Ti/SiO$_2$/Si, Pt/TiO$_2$/SiO$_2$/Si, or Pt/ZnO/SiO$_2$/Si. The method can further comprise depositing an electrode on the film to enable applying the electric field across the film. For example, the electrode can comprise an epitaxial conductive oxide electrode or a metal. For example, the epitaxial conductive oxide electrode can comprise SrRuO$_3$ or (La,Sr)MnO$_3$. For example, the metal can comprise platinum, gold, aluminum, copper, or nickel. The method can further comprise depositing a sacrificial layer on the substrate prior to growing the film and etching away the sacrificial layer to remove the substrate prior to applying the electric field across the film. For example, the sacrificial layer can comprise MgO. Alternatively, the method can further comprise depositing a limited adhesion layer on the substrate prior to growing the film and releasing the substrate from the limited adhesion layer prior to applying the electric field across the film. For example, the substrate can comprise silicon and the limited adhesion layer can comprise ZnO. Alternatively, the substrate can be mechanically and/or chemically thinned prior to applying the electric field across the film.

In general, thermal conductivity can be controlled by applying an electric field to the ferroelectric material. A method by which thermal conductivity can be controlled is by altering the domain structure in the ferroelectric material. Domain boundaries are effective phonon scattering sites in the ferroelectric material and their existence can substantially reduce the thermal conductivity of ferroelectric materials. Domain structure can be modified by supplying a sufficient electric field to alter the domain structure. In some embodiments, if an electric field is applied, these domain boundaries can be swept away from the area under the electrode and increase the thermal conductivity. In other embodiments, the domain boundary density can increase while an electric field is applied. Voltage tunability of thermal conductivity should be possible to some degree in all ferroelectric materials where domain walls can be altered by external stimuli (electric fields, strain, or temperature change). According to another embodiment, thermal conductivity can be controlled in paraelectric materials. In paraelectric materials, where domain boundaries do not exist, an applied voltage can break the degeneracy of the optical soft phonons and acoustic phonons and tune the thermal conductivity. This has been demonstrated in the literature for SrTiO$_3$ at temperatures below 50K. This was only possible at such a low temperature because of the proximity to the incipient ferroelectric transition temperature in SrTiO$_3$. According to the present invention, this phenomenon can be used in (Ba,Sr)TiO$_3$, (Ba,Ca,Sr)TiO$_3$, (Ba,Sr)(Ti,Zr)O$_3$, and (Ba,Sr,Ca,Pb)(Ti,Zr,Hf,Sn)O$_3$ at much higher temperatures because barium and lead substitutions for strontium raise the ferroelectric/paraelectric phase transition temperature.

As an example of the invention, a repeatable 11% modulation of the room temperature thermal conductivity of a ferroelectric thin film, Pb(Zr$_{0.3}$Ti$_{0.7}$)O$_3$, with the application of an electric field was demonstrated. This effect arises from control of the nanoscale ferroelastic domain boundary density under an applied field, which leads to an increased scattering of heat-carrying phonons. The tuning effect is reversible, polarity independent, and occurs on the time scale of ferroelastic domain wall nucleation and growth (sub-second), with theoretical response speeds in the nanosecond time frame.

The invention enables a voltage-tunable thermal conductivity at room temperature, without passing through phase transitions, altering material composition, or physically separating components, thereby providing a new method to control phonon transport that can be used as a basis for actively controlling many additional phonon-mediated phenomena. The invention eliminates the necessity of using moving components or poor efficiency methods to control heat transfer, enabling a means of thermal energy control at the micro- and nano-scales. The ability to dynamically control thermal transport in solid-state systems enables new technologies ranging from thermal management to development of new computing methods utilizing phononic logic. For example, voltage tunable thermal conductivity can be used as a thermal switch to aid in temperature control applications.

BRIEF DESCRIPTION OF THE DRAWINGS

The detailed description will refer to the following drawings, wherein like elements are referred to by like numbers.

FIGS. 5A and 5B are schematic illustrations showing how an electric field can be used to alter the domain wall density in a ferroelectric film and affect phonon transport within the film.

FIG. 6A is a bright-field transmission electron micrograph of a PZT bilayer film imaged in cross-section showing a stripe pattern of 90° ferroelectric domains in the upper PbZr$_{0.3}$Ti$_{0.7}$O$_3$ layer. FIG. 6B is a selected area electron diffraction pattern obtained from the PbZr$_{0.3}$Ti$_{0.7}$O$_3$ layer in FIG. 6A. FIG. 6C is a vertical piezoresponse force microscopy image showing the ferroelectric stripe domain structure of a PZT bilayer film. FIG. 6D is an out of plane raw piezoresponse force signal collected along the black line in FIG. 6C showing the width of the single domains.

FIG. 8A shows a piezoresponse force microscope (PFM) image before and FIG. 8B shows a PFM image after application of an 8 volt bias to the probe tip. FIGS. 8C-F are channeling contrast scanning electron micrographs of the bilayer PZT film in the negatively poled remanent state (FIG. 8C), with +9 volts (~414 kV/cm) applied (FIG. 8D), with −9 volts (~−414 kV/cm) applied (FIG. 8E), and in the positively poled remanent state (FIG. 8F). FIGS. 8H-K show the outlined domain walls for a specific grain from the channeling contrast SEM images in the same respective states as FIGS. 8C-F.

DETAILED DESCRIPTION OF THE INVENTION

The present invention is directed to a method to control thermal energy transport by the use of field-tunable mobile coherent interfaces to scatter phonons in nanoscale ferroelectric films. By reducing material characteristic dimensions to the nanoscale, the density of coherent ferroelastic domain boundaries increases to the concentration and spacing where they can directly impact thermal transport at room temperature and above. Since ferroelastic domain walls in ferroelectrics can be moved and ultimately eliminated through the application of an external electric field, ferroelectric systems enable field-tunable thermal transport behavior. Therefore, thermal conductivity can be actively tuned, simply by applying an electrical potential across the ferroelectric material.

Principal to the concept of using ferroelastic domain walls to affect thermal transport across coherent interfaces is that these interfaces can alter phonon transport. According to the present invention, the type and density of coherent interfaces in ferroelectrics can be controlled utilizing epitaxial or polycrystalline growth strategies and crystal symmetry, providing a framework from which thermal conductivity across these interfaces can be actively controlled. Therefore, as described more fully below, thermal transport across crystallographically coherent interfaces can be modified using nanoscale ferroelectrics. These mobile interfaces can thereby be used to control the heat flux through the material.

By linking mobile interfaces and the tuning of thermal transport, the present invention enables the manipulation of phonon transport in analogous means to that used to control electron flow in forms that are much more easily prepared and addressed than other approaches. In particular, the present invention can actively control thermal conductivity through a thin film by simply applying an electric field, as shown by the graph in FIG. 1D. The successful tuning of thermal conductivity enables the development of new technologies where thermal energy can be modulated in much the same way as is electrical energy.

Figure 1A:
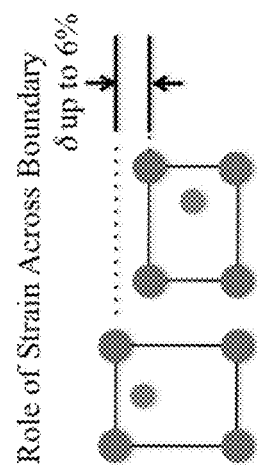
FIGS. 1A and 1B are schematic illustrations of 90° and 109° coherent domain wall interfaces in tetragonal and rhombohedral ferroelectrics, respectively, with phonons scattering on the interfaces.
Figure 1B:
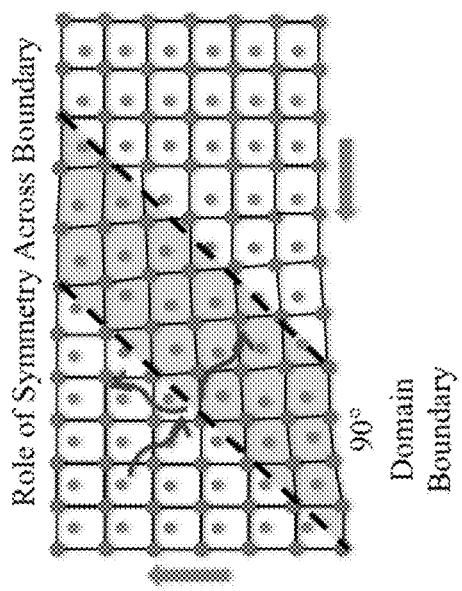
Figure 1C:
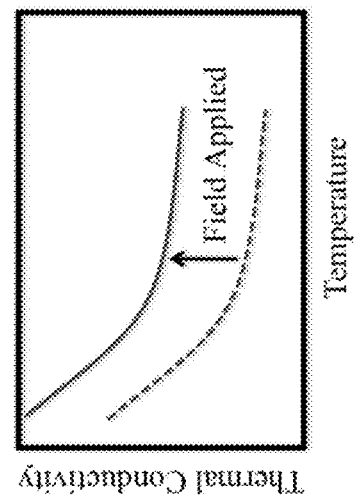
FIG. 1C is a schematic illustration showing the amount of strain that must be accommodated at a domain boundary owing to lattice parameter differences.
Figure 1D:
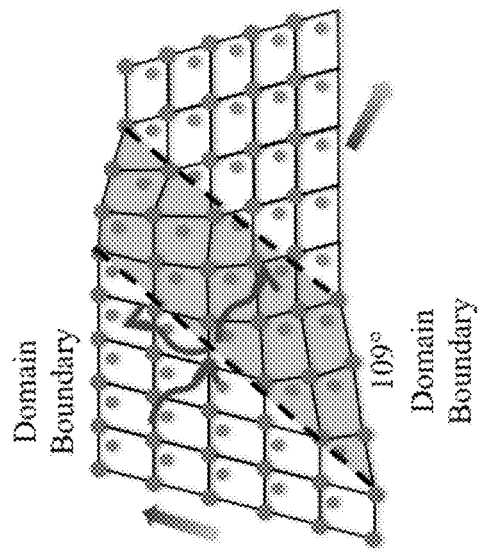
FIG. 1D is a graph illustrating how an applied electric field decreases the domain interface density and thereby increases the thermal conductivity of the material.
Figure 2B:
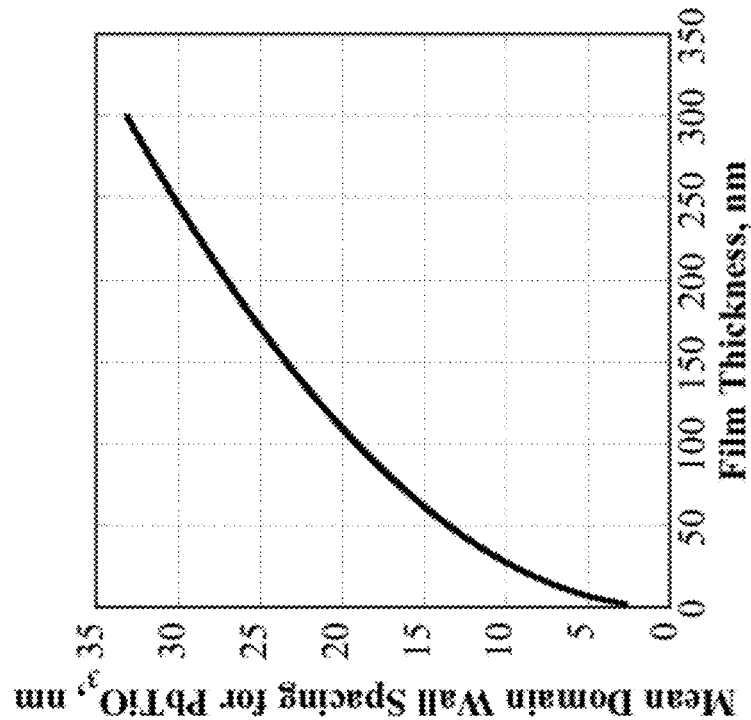
FIG. 2B is a graph of mean domain wall spacing in PbTiO$_3$ thin films as a function of thickness. See M. Tachibana et al., *Appl. Phys. Lett.* 93, 92902 (2008); G. Soyez et al., *Appl. Phys. Lett.* 77, 1155 (2000); G. Catalan et al., *J. Phys.-Condes. Matter* 19, 022201 (2007); and A. G. Beattie and G. A. Samara, *J. Appl. Phys.* 42, 2376 (1971).
Figure 2A:
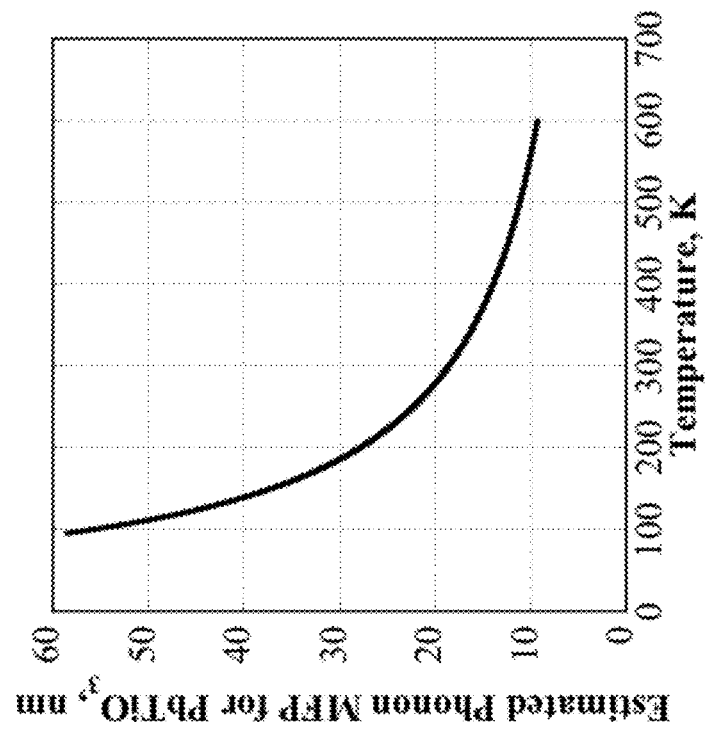
FIG. 2A is a graph of estimated phonon mean free path for PbTiO$_3$ in the temperature regime where Umklapp scattering dominates, as calculated from a Debye model with an estimated Gruneisen parameter.
Figure 3:
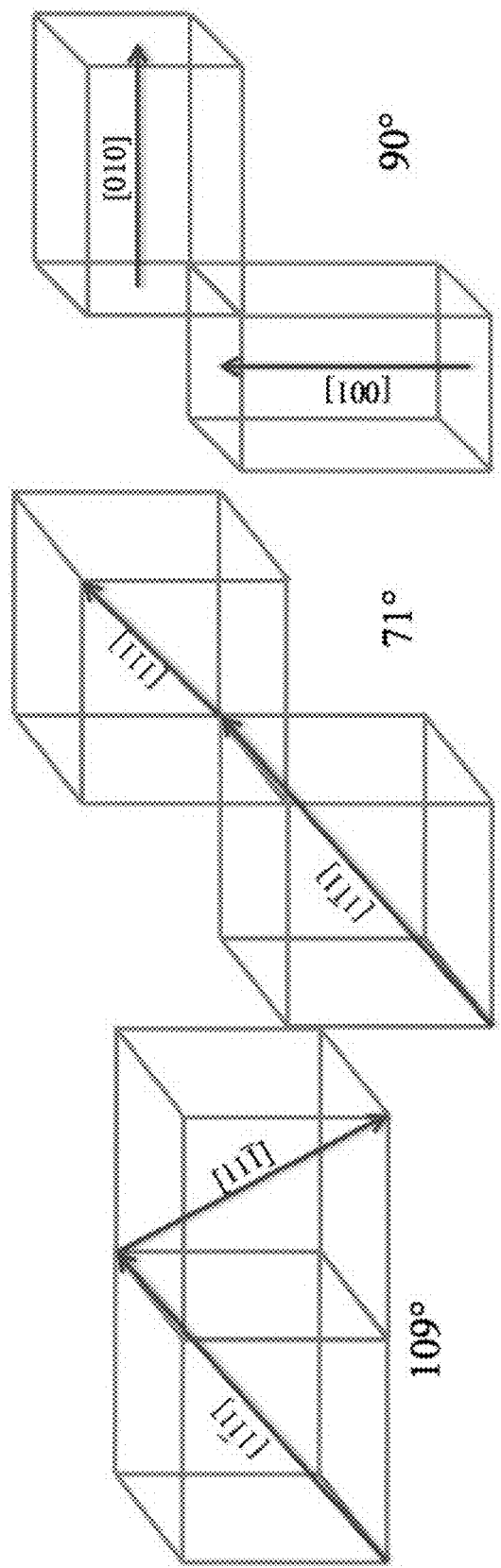
FIG. 3 is a schematic illustration showing the relative polarization vector changes across domain boundaries.

Role of Domain Boundary Symmetry on Thermal Transport in Ferroelectric Oxides The symmetry across a twin boundary can affect phonon transmission coefficients across the interface. This is due to the phonon dispersion dependence of crystallographic direction. While a domain boundary is coherent, the phonon dispersion spectra are asymmetric across the interface. The varied crystallographic symmetries that support ferroelectricity even within the most common perovskite crystal structure provide a number of different domain boundary types. Materials possessing tetragonal symmetry, such as the prototypical perovskite ferroelectrics $PbTiO_3$ and $BaTiO_3$ at room temperature, where the polar axis is parallel to the $<001>_p$ (where the subscript p denotes pseudocubic symmetry for simplicity) lattice directions have two possible types of domain boundaries: 90° domain walls where the boundaries lie along the $\{101\}_p$ lattice planes and 180° walls where the boundaries lie along the $\{100\}_p$ lattice planes. In rhombohedrally symmetric perovskite ferroelectrics, such as $BiFeO_3$ or zirconium-rich compositions of $Pb(Zr,Ti)O_3$, the ferroelectric polar axis lies along the $<111>_p$ body diagonal directions and results in allowed domain boundaries of 71° walls where the boundaries lie along the $\{101\}_p$ lattice planes, 109° walls where the boundaries lie along $\{001\}_p$ lattice planes and 180° walls where the boundaries lie along $\{111\}_p$ lattice planes. These domain boundaries are shown schematically in FIG. 3 (note that in real materials, the domain boundary is not abrupt but rather spans a thickness of ~2 nm as the lattice parameter differences require several unit cells to accommodate the strain at the boundary, as shown in FIGS. 1A and 1B). Accompanying the pure symmetry difference across domain walls, it is known that each type of wall has a different energy level. See A. Lubk et al., *Phys. Rev. B* 80, 104110 (2009). Given the symmetry differences across each type of these boundaries, the type of wall can have an effect on the transport of phonons across the boundary and this can be characterized as a transmission coefficient across these walls.

Epitaxial films of perovskite ferroelectrics can be prepared and the domain boundary types and densities can be finely controlled. Controlling the domain boundary types can be accomplished using two methods:

1) For high polarization materials that can be grown at a temperature below the ferroelectric Curie temperature (e.g., $BiFeO_3$), substrate vicinality, substrate orientation, and growth rate can be used to provide materials with well-controlled populations of domain boundaries. A unique aspect of preparing films below their Curie temperature is that the ferroelectric distortion exists while the film is growing, and can be used to tailor the domain structure. By introducing symmetry breaking step edges in the substrate through a vicinal cut, strain at these steps can be used to confine the polarization axis to a limited number of directions. For $BiFeO_3$ films prepared on substrates with a smaller lattice parameter, such as growth on (001)-oriented $SrTiO_3$, the compressive strain on the $(001)_p$ plane restricts the possible polar axes to be along $[111]_p$, $[\bar{1}11]_p$, or $[\bar{1}\bar{1}1]_p$ and four domain variants can result. A vicinal cut along [010] results in a terraced surface with the step heights equivalent to one unit cell. The compressive strain imposed at the step edge restricts the polarization axes to be along $[111]_p$ and $[\bar{1}11]_p$ representing a decrease in possible domain variants to two. Finally, through using a vicinal cut along [110], the compressive strain along the (100) and (010) planes of the growing film results in just a single domain variant and only 180° domain walls may result, though these are rarely, if ever, observed. See S. H. Baek et al., *Nat. Mater.* 9, 309 (2010). In addition to limiting the number of domain variants, this approach can also be used to tailor the density of domain walls.

Figure 4A:
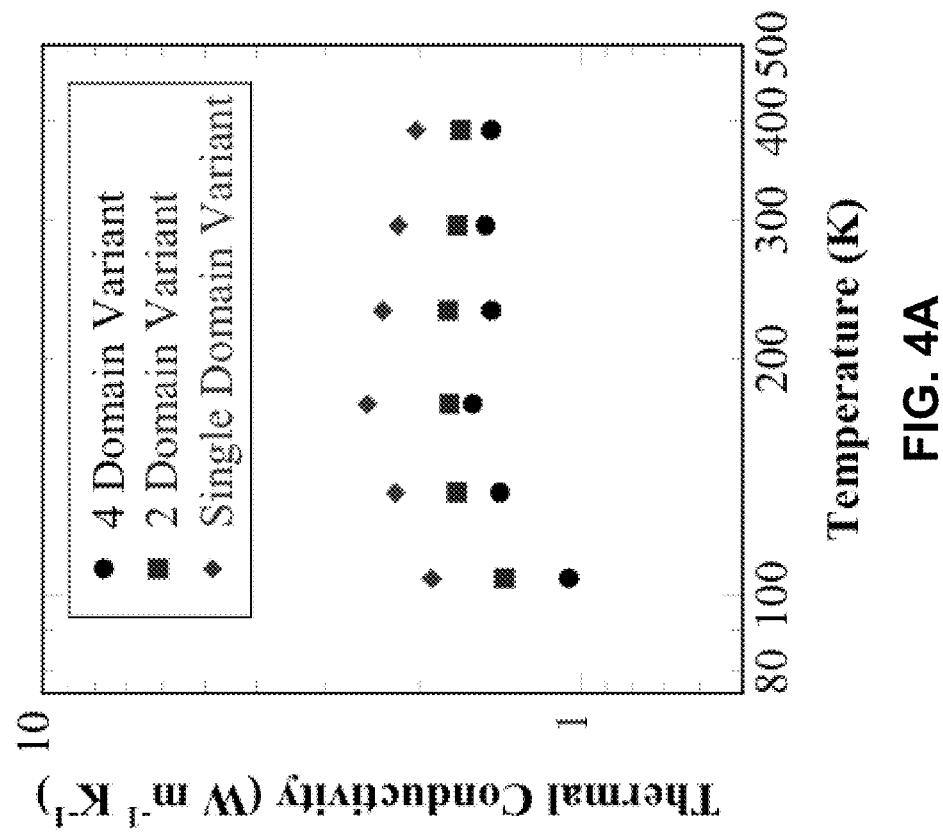
FIG. 4A is a graph of the measured effective thermal conductivity for epitaxial BiFeO$_3$ films with differing densities of domain walls.
Figure 4B:
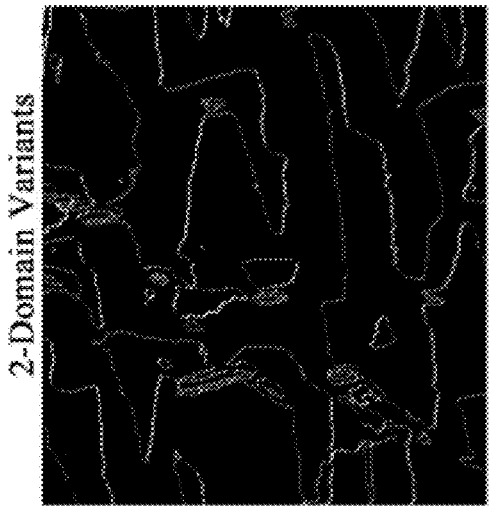
FIGS. 4B and 4C are piezoforce microscopy maps of domain walls for the same 2-variant and 4-variant epitaxial BiFeO$_3$ films. See P. E. Hopkins et al., *Appl. Phys. Lett.* 102, 121903 (2013).
Figure 4C:
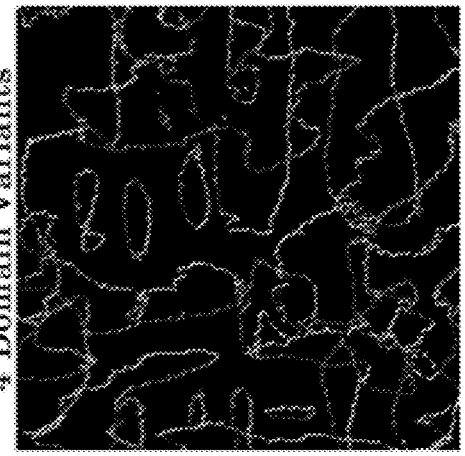

For example, domain walls affect the thermal conductivity of epitaxial $BiFeO_3$ films. Vicinal cut (001)-oriented $SrTiO_3$ substrates can be used to control the number of domain variants (polarization directions) and, ultimately, the linear density of domain walls in epitaxial $BiFeO_3$ films grown on the substrates. Piezoforce microscopy can be used to determine the domain wall types and populations and time domain thermoreflectance (TDTR) can be used to measure the effective thermal conductivity of each of the films. FIGS. 4B and 4C are piezoforce microscopy maps of domain walls for 2-variant and 4-variant epitaxial BiFeO$_3$ films. FIG. 4A is a graph of the measured effective thermal conductivity for epitaxial BiFeO$_3$ films with differing numbers of domain variants. As the number of domain variants and consequent density of domain boundaries increases, the thermal conductivity can be decreased by nearly a factor of two for films with 4 domain variants versus films with no domain walls. It is hypothesized that the presence of domain walls and the inhomogeneous strain associated with these boundaries effectively scatters phonons, resulting in a decrease in thermal conductivity. Furthermore, the ~50 nm spacing of the domain walls is much finer than that present in conventional bulk ceramic or single crystalline materials. This fine spacing and the observation of reduced room temperature thermal conductivity concomitant with the presence of domain walls suggests that the boundaries are interacting with phonons of similar mean free path. Calculations suggest that domain boundaries in BiFeO$_3$ possess a Kapitza conductance of ~100 MW-m$^{-2}$-K$^{-1}$. This was calculated based upon a relatively small sample size, and only for samples with 71° domain walls. See P. E. Hopkins et al., *Appl. Phys. Lett.* 102, 121903 (2013).

2) Lead zirconate titanate (PZT) films can be grow in different orientations, with different thicknesses, or with differing grain sizes to alter the domain wall density. Additionally, the composition dependent symmetry can be used to design materials with known domain wall densities. The phase space in the PbZrO$_3$—PbTiO$_3$ system provides a simple means to control symmetry through composition selection. Films prepared with PbTiO$_3$ concentrations greater than 48 mol % possess tetragonal symmetry and therefore only have 90° and 180° domain walls, and films prepared with less than 47 mol % PbTiO$_3$ possess rhombohedral symmetry and the same domain wall types as are present in BiFeO$_3$. PZT films can be grown on vicinal cut substrates and asymmetric orthorhombic substrates to influence the domain structure. See Folkman et al., *Appl. Phys. Lett.* 94, 251911 (2009).

Role of Biaxial Strain and Domain Boundary Inhomogeneous Strain on Thermal Transport Strain has been predicted to affect thermal transport in materials as discussed above. See X. B. Li et al., *Phys. Rev. B* 81, 245318 (2010). In thin film ferroelectrics there are two major sources of strain: 1) biaxial strain induced by lattice constant mismatch with the substrate and/or thermal expansion coefficient mismatch, and 2) strain at domain boundaries. Biaxial strain can have a significant influence on the domain structure of ferroelectric films. Compressive strain will result in the structure possessing more c-axis oriented domains than a-axis domains in a film with tetragonal symmetry. Likewise, a tensile strain will cause the film to be predominantly a-axis oriented with a minority of c-axis domains. Therefore, strain can affect thermal conductivity and can be a useful tool to aid in engineering the domain structure. There exists a large set of readily available single crystalline substrates that can be used to finely tailor the film strain state. See D. G. Schlom et al., *J. Am. Ceram. Soc.* 91, 2429 (2008). Films can be prepared on a set of single crystalline substrates with differing lattice constants, enabling the strain state to be finely controlled. For example, the effect of compressive strain on thermal transport can be assessed for BiFeO$_3$ films by growing samples on NdGaO$_3$, SrTiO$_3$, and DyScO$_3$ substrates, and growing films on GdScO$_3$ and KTaO$_3$ substrates can assess the effect of tensile strain. Tensile strained PZT films can be prepared on non-perovskite spinel (MgAl$_2$O$_4$) and rocksalt (MgO) substrates. Therefore, lattice mismatch induced biaxial strain can be used to affect thermal conductivity.

In the study described above, with BiFeO$_3$ films the thermal conductivity scaled directly with domain wall density. However, reciprocal space maps measured with X-ray diffraction did not show evidence of the different domain variants that were observed by piezoforce microscopy. This suggests that there is a very high level of inhomogeneous strain at the walls separating the different polarization states. As it is known that strain can alter thermal conductivity, this data suggests that the amount of strain present at the domain walls may have a direct correlation to the transfer of phonon energy across the boundaries. The films in the study were only 30 nm in thickness, a value that is below the critical thickness for strain relaxation for BiFeO$_3$ on SrTiO$_3$. Therefore, strain at the domain boundaries can affect thermal conductance across the walls. Additionally, materials with the same domain wall types, but differing polarization values can be prepared. For example, in the titanium-rich PZT materials, the ferroelectric polarization magnitude ranges from ~35 to 81 µC-cm$^{-2}$. These polarization magnitudes represent tetragonal distortions of the perovskite structure of ~2% to 6%, respectively. See B. Jaffe, W. R. Cook, and H. L. C. Jaffe, *Piezoelectric Ceramics*, Academic Press: London, New York (1971). In spite of the change in lattice parameter, the materials remain tetragonal and the possible domain wall symmetries remain the same. This large difference in tetragonal distortion results in an ability to vary the strain across the domain walls. Combined with an understanding of how strain affects the thermal transport in the bulk of the materials, local strain information can be used to correlate the Kapitza resistance across domain boundaries with the strain present at these interfaces.

Electric Field Tuning of Thermal Conductivity

The ability to dynamically regulate phonon transport in solids would enable possibilities of low input energy thermal control, new computing mechanisms utilizing phonons, and a new means to control other phonon-coupled waves and particles such as polaritons and polarons. See N. B. Li et al., *Rev. Mod. Phys.* 84, 1045 (2012); and S. Dai et al., *Science* 343, 1125 (2014). For broadest impact, it is desirable to have the ability to regulate transport over a large temperature range and to have minimal moving components. Previously, limited means of controlling thermal transport have been achieved. For example, solid-state thermal rectification at room temperature has been demonstrated, but switching, gating, or dynamically tuning elements have remained elusive. See C. W. Chang et al., *Science* 314, 1121 (2006). Thermal switches or tuning of thermal conductivity experiments that have been demonstrated generally require passing through phase transitions, intercalation/deintercalation of ions to change the chemical composition of a material, or cryogenic temperatures combined with magnetic fields in superconductors or electric fields in paraelectric and ferroelectric materials. See D. W. Oh et al., *Appl. Phys. Lett.* 96, (2010); R. T. Zheng et al., *Nat. Commun.* 2, (April, 2011); J. Cho et al., *Nat. Commun.* 5, (June 3/online, 2014); R. A. Richardson et al., *Phys. Rev. Lett.* 67, 3856 (1991); E. F. Steigmeir, *Phys. Rev.* 168, 523 (1968); W. H. Huber et al., *Phys. Rev. B* 62, 8588 (2000); A. J. H. Mante and J. Volger, *Physica* 52, 577 (1971); and F. Q. Lin and D. M. Zhu, *Phys. Rev. B* 49, 16025 (1994).

The present invention provides a broad-temperature range, non-moving-component method to alter phonon conduction through the use of ferroelectric materials. According to the present invention, this nanoscale domain structure and domain wall density can be reconfigured with an applied electric field. Therefore, the thermal conductivity at non-cryogenic temperatures can be arbitrarily tuned using a non-mechanical approach, enabling the creation of a simple thermal switch, for example.

As an example of the invention, FIG. 5A shows an epitaxial ferroelectric film 11 grown on a substrate 12. In this example, the epitaxial film 11 has two domain variants 13 and 14 (i.e., two polarization directions, as indicated by the orthogonal heavy arrows and stippling). The epitaxial ferroelectric film can be prepared with epitaxial conductive oxide or metal electrodes 15 and 16 to enable an electrical field to be applied to the thin film structure 11. For TDTR measurements, a pump laser pulse 17 can be applied to the top electrode 16 to generate phonons 18 in the film 11. These phonons 18 will be scattered 19 at domain boundaries. As shown in FIG. 5B, under the application of a sufficient electric field E=V/t, a finite fraction of the domain boundaries will be swept through the ferroelectric material 11, resulting in an overall reduction of the total domain wall concentration within the area where the field has been applied. By reducing the total number of domain boundaries in this region, the amount of phonon scattering 19 by these domain walls can be reduced and the overall thermal conductivity can be increased. Alternatively, application of the electric field can increase the domain wall density, resulting in a decrease in thermal conductivity in some ferroelectric materials, as will be described below for an exemplary PZT bilayer thin film.

A potential barrier to the observation of tunable thermal conductivity via domain restructuring is the rigid substrate-induced clamping of ferroelastic domain walls that occurs in ferroelectric thin films. On the micro-scale it is possible to switch individual domains over small areas. See F. Zavaliche et al., *Appl. Phys. Lett.* 87, 252902 (2005). Over larger regions, the adherence to rigid substrates substantially limits domain wall motion. See B. A. Tuttle et al., *NATO ASI Series E: Applied Sciences* 284, 117 (1995). To mitigate this effect, known approaches can be used to release thin films from substrates. This can be accomplished by using a sacrificial layer within the substrate that can be readily etched away, such as MgO. Metalized silicon substrates can be used. For example, ZnO can be used as an adhesion layer that can also be dissolved with weak acetic or oxalic acid. See U.S. Pat. No. 8,835,023, to Ihlefeld. Alternative approaches include mechanically or chemically thinning substrates, as is often done to prepare MEMS devices. See G. L. Smith et al., *J. Am. Ceram. Soc.* 95, 1777 (2012).

Room Temperature Tunability of Lead Zirconate Titanate Thin Films

As an example of the invention, lead zirconate titanate (PZT) bilayer thin films were used to demonstrate the ability to control the phonon thermal conductivity in a ferroelectric film via an electric field. Bilayer films composed of a tetragonal symmetry PZT layer ($PbZr_{0.3}Ti_{0.7}O_3$) on top of a rhombohedral symmetry PZT layer ($PbZr_{0.7}Ti_{0.3}O_3$) have previously been shown to possess highly mobile ferroelastic domain walls with sub-100 nm spacing. See V. Anbusathaiah et al., *Adv. Mater.* 21, 3497 (2009). The PZT bilayer films were prepared via chemical solution deposition using a hybrid chelate, inverted mixing order chemistry, using a procedure based upon the work of Kartawidjaja, et al. See R. A. Assink and R. W. Schwartz, *Chem. Mat.* 5, 511 (1993); and F. C. Kartawidjaja et al., *J. Mater. Sci.* 45, 6187 (2010). Films prepared by chemical solution deposition onto platinized silicon wafers had $PbZr_{0.3}Ti_{0.7}O_3$ thicknesses of 142±3 nm and $PbZr_{0.7}Ti_{0.3}O_3$ thicknesses of 57±4 nm.

The films were characterized as being randomly oriented with large, ~860 nm average lateral diameter grains. Platinum electrodes ~500×500 μm in area and nominally 80 nm in thickness were prepared on the film surface to develop metal-insulator-metal structures for electrical and thermal characterization. Thermal conductivity was measured using TDTR using the platinum top electrodes as transducer pads with which to measure and dynamically monitor the film thermal conductivity. See D. G. Cahill, *Rev. Sci. Instrum.* 75, 5119 (2004); A. J. Schmidt et al., *Rev. Sci. Instrum.* 79, (2008); and P. E. Hopkins et al., *J. Heat Transf.-Trans. ASME* 132, (2010). DC electric fields of up to 460 kV/cm were applied between the top and bottom platinum electrodes during TDTR measurements to test the voltage control of thermal conductivity of the PZT bilayer thin films.

The structure of the films was investigated using transmission electron microscopy (TEM). As shown in the bright field TEM micrograph in FIG. 6A, parallel bands of contrast consistent with a domain structure are observed within the grains of the upper $PbZr_{0.3}Ti_{0.7}O_3$ layer. FIG. 6B is a selected area electron diffraction pattern obtained from the $PbZr_{0.3}Ti_{0.7}O_3$ layer in FIG. 6A. The pattern is indexed as two superimposed 90° domain variants with zone axes oriented along [021] and [01$\bar{2}$] directions. The stripes in the image in FIG. 6A are aligned with the [100] direction and are normal to the (0$\bar{1}$2) and (021) reflections in the diffraction pattern. This arrangement is consistent with 90° domain walls lying on (0$\bar{1}$1) and (011) planes, which for this grain orientation would be inclined away from an edge-on alignment with the imaging direction by 18.6°. Therefore, this analysis of the crystallographic orientation of the stripe contrast shows that these stripes are consistent with 90° ferroelastic domain walls, which lie parallel with {101} type planes in the tetragonal $PbZr_{0.3}Ti_{0.7}O_3$ phase. See S. Stemmer, *Philos. Mag. A-Phys. Condens. Matter Struct. Defect Mech. Prop.* 71, 713 (1995). The presence of distinct domains and their existence only in the $PbZr_{0.3}Ti_{0.7}O_3$ layer is consistent with prior work on similar films. See V. Anbusathaiah et al., *Adv. Mater.* 21, 3497 (2009); and V. Anbusathaiah et al., *Acta Mater.* 58, 5316 (2010). The spacing of the domain walls as measured across multiple TEM micrographs ranges from ~5 nm to 36 nm with a mean spacing of 16.5±6.6 nm. A piezoresponse force microscopy (PFM) image of the film surface is shown in FIG. 6C, where distinct stripe domains can be observed. The intensity of the out-of-plane PFM response was measured perpendicular to the stripe direction as shown in FIG. 6D and reveals a mean domain wall spacing of 30.4±3.3 nm for this particular region.

Figure 7A:
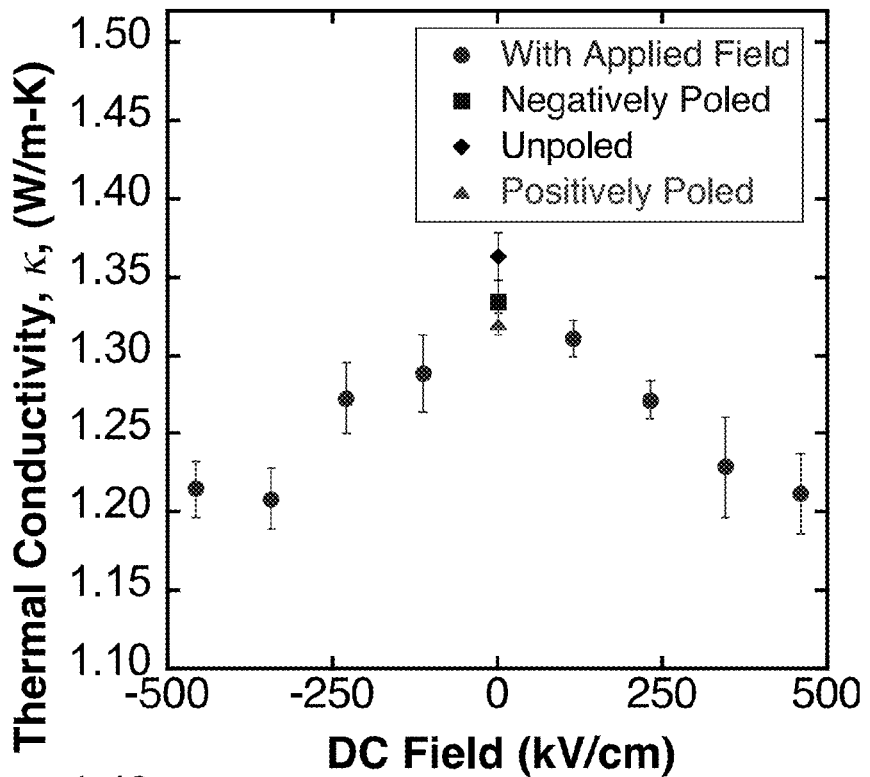
FIG. 7A is a graph of the DC electric field dependence of thermal conductivity in the PbZr$_{0.3}$Ti$_{0.7}$O$_3$ layer of the PZT bilayer film measured at room temperature. Also shown are the zero-field thermal conductivities of the initially unpoled material and those of the remanent poled material after application of positive and negative bias.
Figure 7B:
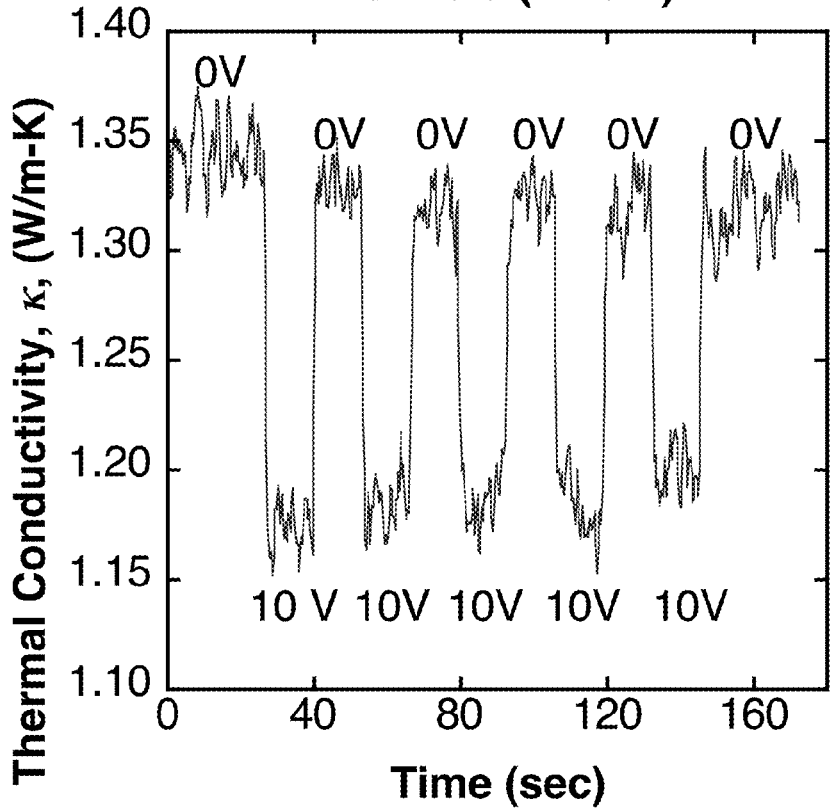
FIG. 7B is a graph of the real-time change in thermal conductivity measured via time domain thermoreflectance (TDTR) at a delay time of 150 ps, showing the dynamic response of the thermal conductivity tuning effect.

FIG. 7A shows the field dependence of thermal conductivity for the tetragonal $PbZr_{0.3}Ti_{0.7}O_3$ layer of the bilayer film. The thermal conductivity decreases by 11% from the unpoled, virgin state under an applied field of 460 kV/cm. Upon removal of the applied field, it was found that the thermal conductivity did not recover fully to its original value, but that the thermal conductivity in the remanent poled, ferroelectric state was ~2.7% less than that in the unpoled state. To better understand the speed and reproducibility of the field-induced thermal conductivity change, the thermoreflectivity of the top electrode was monitored at a fixed pump-probe delay time of 150 ps while cycling the applied DC field across the sample between 0 and 460 kV/cm (0 and 10 V). FIG. 7B shows the time dependence of the thermal conductivity while cycling the DC field. A nearly instantaneous decrease (less than 300 ms, limited by the integration time of the lock-in amplifier) was observed in the thermal conductivity when the field was applied, which recovered when the field was removed. This demonstrates that the thermal conduction decrease is rapid and recoverable between the poled (remanent) and applied-field states.

The above results show that the thermal conductivity for these ferroelectric films decreases with applied field. To understand the mechanism for this result, the domain structure before and after poling was characterized with PFM and in operando during application of electric fields with channeling contrast scanning electron microscopy (SEM). The PFM measurements were conducted with a conductive tip and no top electrode. The channeling contrast measurements utilized a 3 nm thick platinum electrode, which was thin enough to enable sufficient transparency for electron imaging, but thick enough to apply a field across the PZT film. FIGS. 8A and 8B show PFM images of a representative region of a bilayer film prior-to and after poling with an 8 volt bias. Edge identification was used to measure the domain wall length before and after application of the field. See D. Marr and E. Hildreth, *P. Roy. Soc. B. Biol. Sci.* 207, 187 (1980). The outlines on the images in FIGS. 8A and 8B are the edge identification boundaries used to determine the percent change in domain wall area. Domain wall length measured in this manner is a direct reflection of domain wall density in the film. The amount of domain wall length change observed varied over six measured regions, and multiple grains studied, with some areas decreasing, but most increasing. Changes of −4.1 to +8.3% were observed in domain wall line length/unit area after poling of the sample with an overall average increase of 2.6%. FIGS. 8C-F show channeling contrast SEM images in states of negatively poled (zero applied field, but in the negative remanent ferroelectric state), positive applied field, positively poled (zero applied field, but in the positive remanent ferroelectric state), and negative applied field, respectively. Qualitatively, clear voltage-induced domain structure changes were observed in each state. Edge identification was used to quantify the domain wall line length in regions where domains in each state could unambiguously be identified, with the results for one grain shown in FIGS. 8H-K. The domain wall density was found to increase under the application of field compared to a zero field, poled film state. For the grain highlighted in this figure, increases of 9.9 and 10.2% were observed in domain wall line length/unit area relative to the negatively poled state under fields of −414 and 414 kV/cm, respectively. The amount of change in domain boundary length varied by the grain measured, greater than a 2% increase in domain wall length from the remanent state were routinely observed while the sample was under an applied field. It is important to note that the 12 μm diameter of the laser spot used for the TDTR measurements resulted in a measurement volume that encompasses several adjacent grains, ensuring that the average increase in domain wall length/unit area was captured in each thermal measurement.

Combined, the PFM and SEM domain imaging data show that the domain wall densities increased after and during the application of a DC field for these bilayer films. Increases in domain wall density in polycrystalline PZT thin films and PZT bilayers have been observed previously between unpoled and poled states via PFM. See Y. Ivry et al., *Phys. Rev. B* 81, 174118 (2010); V. Anbusathaiah et al., *Adv. Mater.* 21, 3497 (2009); V. Anbusathaiah et al., *Acta Mater.* 58, 5316 (2010); and Y. Ehara et al., *Appl. Phys. Lett.* 99, (2011). However, this example demonstrates the first increase in domain wall density while under an applied field, particularly at these fine length scales. This increase is a consequence of several factors, including the interplay of ferroelectric switching and ferroelastic domains, and strain relief from the imposed mechanical boundary conditions that exist at grain boundaries and clamping to a rigid silicon substrate. See Y. Ivry et al., *Phys. Rev. B* 81, 174118 (2010); and Y. Ivry et al., *Nanotechnology* 21, 065702 (2010).

These increases in domain wall density correlate with the measured decreases in thermal conductivity after poling into the remanent ferroelectric states and while under the application of an electric field. The decreased thermal conductivity with increasing domain wall density results from increased phonon scattering across the domain walls. In addition to the increase in domain boundary area resulting in increased phonon scattering interfaces, an accompanying necessary decrease in domain wall spacing is likely to result in phonons of shorter mean free path lengths being scattered by domain walls, which may amplify this thermal conductivity tuning effect. As a consequence of phonon scattering at domain boundaries, it is expected that this tuning effect can occur at the timescale of ferroelastic switching, which for similar materials has been shown to occur in the nanosecond time frame. See Y. Ehara et al., *Appl. Phys. Lett.* 99, (2011); and J. Li et al., *Appl. Phys. Lett.* 84, 1174 (2004). This indicates the response time can be significantly faster than could be measured using the above experimental setup.

Finally, given the rich physics present in ferroelectrics, it is important to differentiate the effects observed above from electrocaloric effects. The application of a large electric field to a ferroelectric thin film results in a change in entropy and a concomitant change in temperature under adiabatic conditions. See A. S. Mischenko et al., *Science* 311, 1270 (2006). The electrocaloric effect is a transient response that would not be observable over the several minute timescales these measurements, rather the response such as the locked-in thermal conductivity data in FIG. 7B would decay with time and would have opposite sign temperature variations for applying and removing the electric field; i.e. the temperature would increase quickly and then equilibrate while a field is applied and then decrease quickly and equilibrate upon removal of the field. That this was not observed suggests that electrocaloric effects constitute a minimal contribution to these measurements.

Therefore, finely spaced ferroelastic domain boundaries in ferroelectric thin films can be used to alter phonon transport and prepare a voltage-actuated thermal switch at temperatures well in excess of any previous demonstration. This effect can be used across broad temperature ranges and does not require physically separating components, altering the composition of the material, or use of phase transitions that are only operable in narrow temperature ranges. In addition, the dynamic tuning of thermal conductivity is rapid and repeatable, with the exception of the thermal conduction loss from the unpoled to the poled remanent ferroelectric state. Through the application of domain structure engineering, nanosecond domain switching, and improved understanding of the phonon mean free path spectra in ferroelectric materials, this dynamic tuning effect can be further increased in amplitude and also potentially lead toward GHz tuning of phonons. Finally, other phonon-related phenomena can be similarly tuned, opening other avenues for actuated energy control.

The present invention has been described as a method for voltage tunability of thermal conductivity in piezoelectric materials. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method to control thermal conductivity in a ferroelectric material, comprising:
    growing an epitaxial or polycrystalline film of ferroelectric material on a substrate; and
    applying a sufficient electric field across the film to modify the domain structure in the film, thereby altering the thermal conductivity of the film.

2. The method of claim 1, wherein the spacing of the domain walls of the domain structure is less than or comparable to the mean free path of phonons at a temperature of interest.

3. The method of claim 2, wherein the temperature of interest is between 30K and 600K.

4. The method of claim 1, wherein the thickness of the film is less than 5 micron.

5. The method of claim 1, wherein the ferroelectric material comprises a perovskite ferroelectric.

6. The method of claim 5, wherein the perovskite ferroelectric comprises a rhombohedrally symmetric perovskite ferroelectric, a tetragonally symmetric perovskite ferroelectric, or an orthorhombic perovskite ferroelectric.

7. The method of claim 5, wherein the perovskite ferroelectric comprises $(Pb,La)(Zr,Ti,Nb)O_3$, $BaTiO_3$, $BiFeO_3$, or $(Bi,RE)FeO_3$, where RE is a lanthanide metal cation.

8. The method of claim 1, wherein the ferroelectric material comprises $(Ba,Sr)TiO_3$, $(Ba,Ca,Sr)TiO_3$, $(Ba,Sr)(Ti,Zr)O_3$, or $(Ba,Sr,Ca,Pb)(Ti,Zr,Hf,Sn)O_3$.

9. The method of claim 1, wherein the ferroelectric material comprises a relaxor ferroelectric.

10. The method of claim 1, wherein the ferroelectric material comprises a ferroelastic material.

11. The method of claim 1, wherein the ferroelectric material comprises a paraelectric material.

12. The method of claim 1, wherein the substrate comprises a single crystal substrate.

13. The method of claim 12, wherein the single crystal substrate has a lattice constant that is different than the film, thereby imposing strain on the film.

14. The method of claim 13, wherein the ferroelectric material comprises $BiFeO_3$ and the single crystal substrate comprises $NdGaO_3$, $SrTiO_3$, or $DyScO_3$, thereby imposing a compressive strain on the $BiFeO_3$ film.

15. The method of claim 13, wherein the ferroelectric material comprises $BiFeO_3$ and the single crystal substrate comprises $GdScO_3$ or $KTaO_3$, thereby imposing a tensile strain on the $BiFeO_3$ film.

16. The method of claim 13, wherein the ferroelectric material comprises $Pb(Zr,Ti)O_3$ and the single crystal substrate comprises non-perovskite spinel $(MgAl_2O_4)$ or rocksalt (MgO), thereby imposing a tensile strain on the $Pb(Zr,Ti)O_3$ film.

17. The method of claim 1, wherein the substrate comprises a vicinal substrate.

18. The method of claim 17, wherein the ferroelectric material comprises $BiFeO_3$ and the vicinal substrate comprises (001)-oriented $SrTiO_3$, thereby imposing a compressive strain on the $BiFeO_3$ film.

19. The method of claim 1, wherein the substrate comprises metallized silicon.

20. The method of claim 1, further comprising depositing an electrode on the film to enable applying the electric field across the film.

21. The method of claim 20, wherein the electrode comprises an epitaxial conductive oxide electrode.

22. The method of claim 21, wherein the epitaxial conductive oxide electrode comprises $SrRuO_3$ or $(La,Sr)MnO_3$.

23. The method of claim 20, wherein the electrode comprises a metal.

24. The method of claim 1, further comprising depositing a sacrificial layer on the substrate prior to growing the film and etching away the sacrificial layer to remove the substrate prior to applying the electric field across the film.

25. The method of claim 24, wherein the sacrificial layer comprises MgO or ZnO.

26. The method of claim 1, wherein the substrate is mechanically and/or chemically thinned prior to applying the electric field across the film.

* * * * *